United States Patent
Han et al.

(10) Patent No.: US 10,819,284 B2
(45) Date of Patent: Oct. 27, 2020

(54) CIRCUITS FOR MODULATED-MIXER-CLOCK MULTI-BRANCH RECEIVERS

(71) Applicants: Guoxiang Han, New York, NY (US); Tanbir Haque, New York, NY (US); Peter R. Kinget, Summit, NJ (US)

(72) Inventors: Guoxiang Han, New York, NY (US); Tanbir Haque, New York, NY (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 16/579,782

(22) Filed: Sep. 23, 2019

(65) Prior Publication Data

US 2020/0099338 A1   Mar. 26, 2020

Related U.S. Application Data

(60) Provisional application No. 62/734,957, filed on Sep. 21, 2018.

(51) Int. Cl.
*H04B 1/10* (2006.01)
*H03D 7/14* (2006.01)
(Continued)

(52) U.S. Cl.
CPC ......... *H03D 7/1466* (2013.01); *H03F 1/0205* (2013.01); *H03F 1/26* (2013.01);
(Continued)

(58) Field of Classification Search
CPC ....... H03D 7/1466; H03F 1/0205; H03F 1/26; H03F 3/193; H03F 3/45179;
(Continued)

(56) References Cited

U.S. PATENT DOCUMENTS 7,190,833 B2  3/2007  Kagehiro et al.
7,245,668 B2  7/2007  Feher
(Continued)

OTHER PUBLICATIONS

A. Mirzaei and H. Darabi, "Analysis of imperfections on performance of four-phase passive-mixer-based high-Q bandpass filters in SAWless receivers," IEEE Transactions on Circuits and Systems I: Regular Papers, vol. 58, No. 5, pp. 879-892, May 2011.
(Continued)

*Primary Examiner* — Sonny Trinh
(74) *Attorney, Agent, or Firm* — Byrne Poh LLP (57) ABSTRACT

Circuits comprising: a plurality of LNTA branches, each comprising: a cascode common-source (CCS) LNTA, a plurality of passive mixers (PMs), and a plurality of baseband two-stage Miller compensated TIAs (BB2S-TIAs); a plurality of mixer-first branches, each comprising: a plurality of RF switches, a plurality of baseband folded-cascode TIAs (BBFC-TIAs), and a plurality of Cherry-Hooper amplifiers, wherein an input to each of the BBFC-TIAs is provided by an output of at least one of the RF switches, and an input to each of the amplifiers is provided by an output of a corresponding one of the BBFC-TIAs; a first plurality of clock modulators that provide first non-overlapping modulated clocks that are provided to an input of the PMs; and a second plurality of clock modulators that provide a plurality of tri-level modulated mixer clocks that control the switching of the RF switches.

17 Claims, 6 Drawing Sheets

(51) Int. Cl.
　　　H03F 3/193　　(2006.01)
　　　H03F 3/45　　(2006.01)
　　　H03F 1/26　　(2006.01)
　　　H04B 1/16　　(2006.01)
　　　H03F 1/02　　(2006.01)
(52) U.S. Cl.
　　　CPC ......... H03F 3/193 (2013.01); H03F 3/45179 (2013.01); H03F 3/45403 (2013.01); H04B 1/109 (2013.01); H04B 1/16 (2013.01); *H03F 2200/294* (2013.01); *H03F 2203/45024* (2013.01)
(58) Field of Classification Search
　　　CPC ........... H03F 3/45403; H03F 2200/294; H03F 2203/45024; H04B 1/109; H04B 1/16
　　　USPC ......................................................... 455/311
　　　See application file for complete search history.

(56) References Cited

U.S. PATENT DOCUMENTS

| | | | |
|---|---|---|---|
| 7,436,912 B2 | 10/2008 | Fudge et al. | |
| 8,731,506 B2 * | 5/2014 | Rossi | H03F 1/223 455/323 |
| 9,276,535 B2 * | 3/2016 | van Sinderen | H03F 1/342 |
| 9,325,553 B2 | 4/2016 | Kaukovuori et al. | |
| 10,027,352 B2 * | 7/2018 | Mastantuono | H03F 3/193 |
| 2010/0202566 A1 | 8/2010 | Fudge et al. | |
| 2017/0054456 A1 * | 2/2017 | Mastantuono | H04B 1/005 |
| 2017/0155414 A1 * | 6/2017 | Selvanayagam | H03F 1/0205 |
| 2018/0287559 A1 * | 10/2018 | Zhu | H03H 7/48 |

OTHER PUBLICATIONS

A. Mirzaei et al., "Analysis and optimization of direct-conversion receivers with 25% duty-cylce current-driven passive mixers," IEEE Transactions on Circuits and Systems I: Regular Papers, vol. 57, No. 9, pp. 2353-2366, Sep. 2010.
Agrawal et al. "An interferer-tolerant CMOS code-domain receiver based on N-path filters", in IEEE Journal of Solid-State Circuits, vol. 53, issue 5, Feb. 2018, pp. 1387-1397.
B. Gilbert, "A precise four-quadrant multiplier with subnanosecond response," IEEE Journal of Solid-State Circuits, vol. 3, No. 4, pp. 365-373, Dec. 1968.
B. Razavi, "Design considerations for direct-conversion receivers," IEEE Transactions on Circuits and Systems II: Analog and Digital Signal Processing, vol. 44, No. 6, pp. 428-435, Jun. 1997.
C. S. Park et al., "Carrier aggregation for LTE-advanced: design challenges of terminals," IEEE Communications Magazine, vol. 51, No. 12, pp. 76-84, Dec. 2013.
Caldwell et al., "A reconfigurable Delta Sigma ADC with up to 100 MHz bandwidth using flash reference shuffling", in IEEE Transactions on Circuits and Systems I: Regular Papers, vol. 61, issue 8, Jul. 2014, pp. 2263-2271.
D. Adams et al., "A mixer front end for a four-channel modulated wideband converter with 62-dB blocker rejection," IEEE Journal of Solid-State Circuits, vol. 52, No. 5, pp. 1286-1294, May 2017.
D. Murphy et al., "A blocker-tolerant, noise-cancelling receiver suitable for wideband wireless applications," IEEE Journal of Solid-State Circuits, vol. 47, No. 12, pp. 2943-2963, Dec. 2012.
D. R. Pehlke and K. Walsh, "LTE-advanced Pro RF front-end implementations to meet emerging carrier aggregation and DL MIMO requirements," IEEE Communications Magazine, vol. 55, No. 4, pp. 134-141, Apr. 2017.
G. Han et al., "A 0.3-to-1.3GHz multi-branch receiver with modulated mixer clocks for concurrent dual-carrier reception and rapid compressive-sampling spectrum scanning," in 2019 IEEE Radio Frequency Integrated Circuits Symposium (RFIC), Jun. 2019, pp. 95-98.

Grimm et al., "Non-linearly induced interference and its mitigation in cognitive wideband receivers", in the Proceedings of the 18th European Wireless Conference, Jun. 2012.
H. Wu et al., "A harmonic-selective multi-band wireless receiver with digital harmonic rejection calibration," IEEE Journal of Solid-State Circuits, vol. 54, No. 3, pp. 796-807, Mar. 2019.
I. Fabiano et al., "SAW-less analog front-end receivers for TDD and FDD," IEEE Journal of Solid-State Circuits, vol. 48, No. 12, pp. 3067-3079, Dec. 2013.
J. Crols and M. S. J. Steyaert, "A 1.5 GHz highly linear CMOS downconversion mixer," IEEE Journal of Solid-State Circuits, vol. 30, No. 7, pp. 736-742, Jul. 1995.
J. Zhu and P. R. Kinget, "A field-programmable noise-canceling wideband receiver with high-linearity hybrid class-AB-C LNTAs," in 2015 IEEE Custom Integrated Circuits Conference (CICC), Sep. 2015, pp. 1-4.
Jiang et al., "Improving pedestrian safety in urban cities using intelligent wearable systems", NSF Award No. 1704899, May 26, 2017.
L. Sundstrom et al., "A receiver for LTE Rel-11 and beyond supporting non-contiguous carrier aggregation," in 2013 IEEE International Solid-State Circuits Conference Digest of Technical Papers, Feb. 2013, pp. 336-337.
Maleh et al., "Analog-to-information and the Nyquist folding receiver", in IEEE Journal on Emerging and Selected Topics in Circuits and Systems, vol. 2, issue 3, Nov. 2012, pp. 564-578.
Murphy et al., "A noise-cancelling receiver with enhanced resilience to harmonic blockers", in IEEE International Solid-State Circuits Conference, Mar. 2014.
Olopade et al., "Concurrent dual-band six-port receiver for multistandard and software defined radio applications", in IEEE Transactions on Microwave Theory and Techniques, vol. 61, Issue 12, Nov. 2013, pp. 4252-4261.
R. Chen and H. Hashemi, "Reconfigurable receiver with radio-frequency current-mode complex signal processing supporting carrier aggregation," IEEE Journal of Solid-State Circuits, vol. 50, No. 12, pp. 3032-3046, Dec. 2015.
R. T. Yazicigil et al., "How to make analog-to-information converters work in dynamic spectrum environments with changing sparsity conditions," IEEE Transactions on Circuits and Systems I: Regular Papers, vol. 65, No. 6, pp. 1775-1784, Jun. 2018.
R. T. Yazicigil et al., "Wideband rapid interferer detector exploiting compressed sampling with a quadrature analog-to-information converter," IEEE Journal of Solid-State Circuits, vol. 50, No. 12, pp. 3047-3064, Dec. 2015.
Ramakrishnan et al., "An FD/FDD transceiver with RX band thermal, quantization, and phase noise rejection and >64dB TX signal cancellation", in IEEE Radio Frequency Integrated Circuits Symposium, Jul. 2017.
S. Hwu and B. Razavi, "An RF receiver for intra-band carrier aggregation," IEEE Journal of Solid-State Circuits, vol. 50, No. 4, pp. 946-961, Apr. 2015.
Sever et al., "A dual-antenna phase-array ultra-wideband CMOS transceiver", in IEEE Communications Magazine, vol. 44, issue 8, Aug. 2006, pp. 102-110.
T. Haque et al., "A Reconfigurable Architecture Using a Flexible LO Modulator to Unify High-Sensitivity Signal Reception and Compressed-Sampling Wideband Signal Detection," JSSC, pp. 1577-1591, 2018.
T. Haque et al., "Flexible architectures for concurrent reception of multiple RF carriers and compressed-sampling signal detection in frequency and direction-of-arrival," in 2019 IEEE MTT-S International Microwave Conference (IMC) on Hardware and Systems for 5G and Beyond, Aug. 2019.
Wantanabe et al., "Synchronization clock frequency modulation technique for compromising emanations security", in the Proceedings of the International Symposium on Electromagnetic Compatibility, Jul. 2009.
Wright et al., "Learning and adapting sparse recovery algorithms for RF spectrum sensing", NSF Award No. 1733857, Aug. 23, 2017.
X. J. Li and Y. P. Zhang, "Flipping the CMOS switch," IEEE Microwave Magazine, vol. 11, No. 1, pp. 86-96, Feb. 2010.
Zhu et al., "A very-low-noise frequency-translational quadrature-hybrid receiver for carrier aggregation", in IEEE International Solid-State Circuits Conference, Feb. 2016, pp. 168-169.

(56) References Cited

OTHER PUBLICATIONS

Zhu et al., "Frequency-translational quadrature-hybrid receivers for very-low-noise, frequency-agile, scalable inter-band carrier aggregation", in IEEE Journal of Solid-State Circuits, vol. 51, issue 12, Dec. 2016, pp. 3137-3151.

* cited by examiner

CIRCUITS FOR MODULATED-MIXER-CLOCK MULTI-BRANCH RECEIVERS

CROSS REFERENCE TO RELATED APPLICATION

This application claims the benefit of U.S. Provisional Patent Application No. 62/734,957, filed Sep. 21, 2018, which is hereby incorporated by reference herein in its entirety.

STATEMENT REGARDING FEDERALLY SPONSORED RESEARCH OR DEVELOPMENT

This invention was made with government support under grant 1733857 awarded by the National Science Foundation. The government has certain rights in the invention.

BACKGROUND

Current circuits for receiving multiple frequencies at the same time suffer from many performance problems.

Accordingly, it is desirable to provide new circuits for receiving multiple frequencies at the same time.

SUMMARY

Circuits for modulated-mixer-clock multi-branch receivers are provided. In some embodiments, circuits for modulated-mixer-clock multi-branch receivers comprise: a plurality of low-noise transconductance amplifier (LNTA) branches, each comprising: a cascode common-source LNTA, a plurality of passive mixers, and a plurality of baseband two-stage Miller compensated transimpedance amplifiers (TIAs), wherein an input to the cascode common-source LNTA is provided by a radio frequency (RF) signal source, an input to each of the plurality of passive mixers is provided by an output of the cascode common-source LNTA, and an input to each of the plurality of baseband two-stage Miller compensated TIAs is provided by an output of a corresponding one of the plurality of passive mixers; a plurality of mixer-first branches, each comprising: a plurality of RF switches, a plurality of baseband folded-cascode TIAs, and a plurality of Cherry-Hooper amplifiers, wherein an input to the plurality of RF switches is provided by the RF signal source, an input to each of the plurality of baseband folded-cascode TIAs is provided by an output of at least one of the plurality of RF switches, and an input to each of the plurality of Cherry-Hooper amplifiers is provided by an output of a corresponding one of the plurality of baseband folded-cascode TIAs; a first plurality of clock modulators that provide first non-overlapping modulated clocks that are provided to an input of the plurality of passive mixers; and a second plurality of clock modulators that provide a plurality of tri-level modulated mixer clocks that control the switching of the plurality of RF switches.

DETAILED DESCRIPTION

In accordance with some embodiments, modulated-mixer-clock (MMC) multi-branch receivers are provided.

Figure 1:
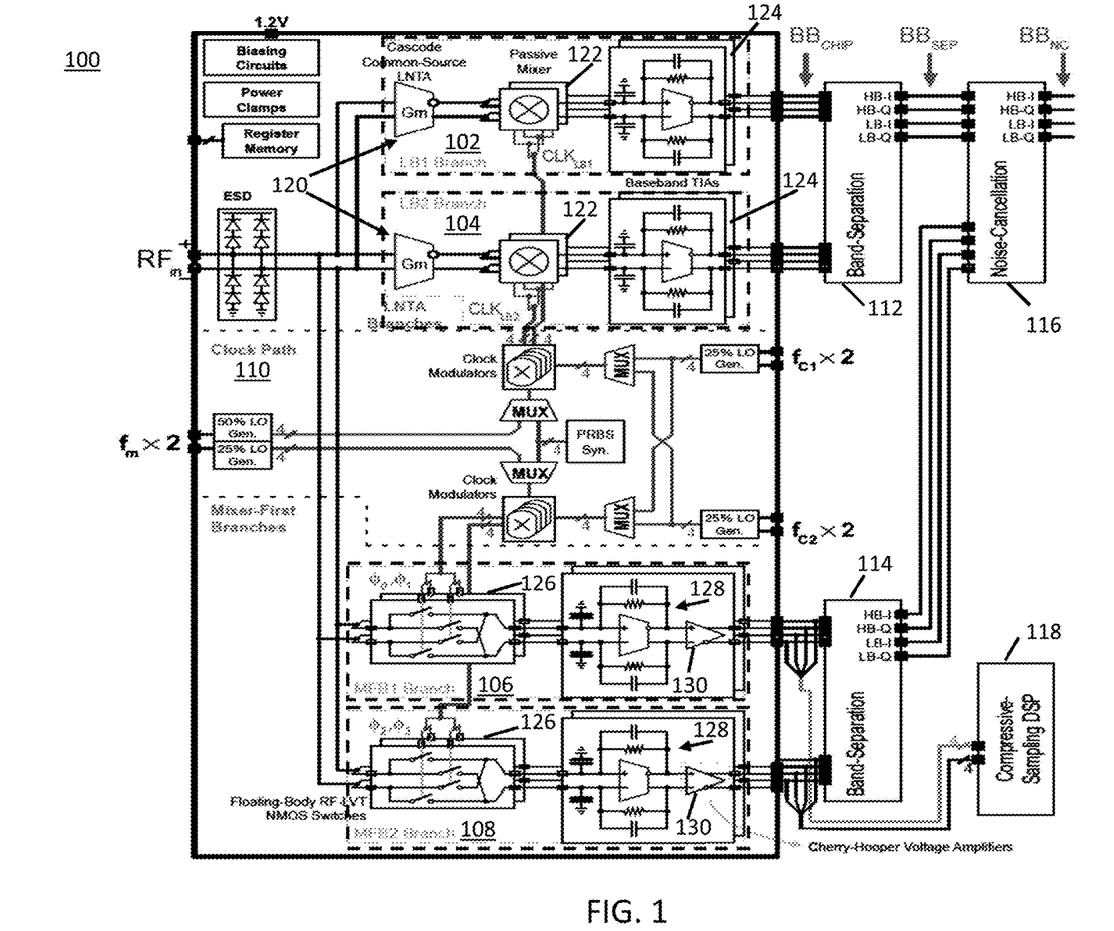
FIG. 1 is an example of a receiver in accordance with some embodiments.

In some embodiments, a modulated-mixer-clock (MMC) multi-branch receiver can be implemented as shown by example receiver 100 of FIG. 1. As illustrated, receiver 100 can include a two low-noise transconductance amplifier (LNTA) branches ($LB_1$ 102 and $LB_2$ 104), two mixer-first branches ($MFB_1$ 106 and $MFB_2$ 108), clock path circuitry 110, band separation circuits 112 and 114, noise cancellation circuits 116, and compressive sampling digital signal processor (DSP) 118 in some embodiments.

Each of LNTA branches $LB_1$ 102 and $LB_2$ 104 in receiver 100 can include a cascode common-source LNTA (Gm) 120, differential passive mixers 122, and baseband two-stage Miller compensated trans-impedance amplifiers (TIAs) 124 in some embodiments.

Figure 3:
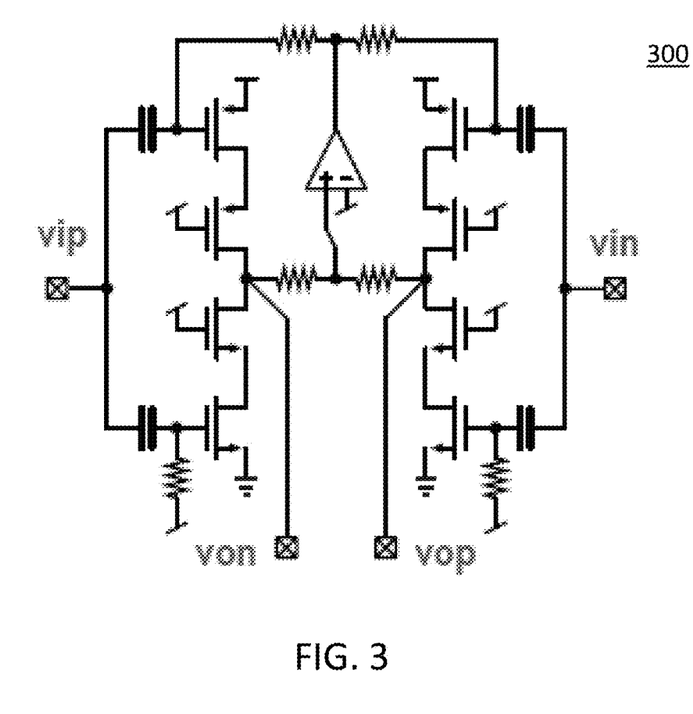
FIG. 3 is an example of a cascode common-source low noise transconductance amplifier that can be used in a receiver in accordance with some embodiments.

An example 300 of a circuit that can be used to implement cascode common-source LNTA (Gm) 120 in accordance with some embodiments is shown in FIG. 3.

Each of mixer-first branches $MFB_1$ 106 and $MFB_2$ 108 can include RF switches 126, baseband folded-cascode TIAs 128, and Cherry-Hooper amplifiers with programmable degeneration and feedback resistors for gain and linearity control 130 in some embodiments.

Figure 5:
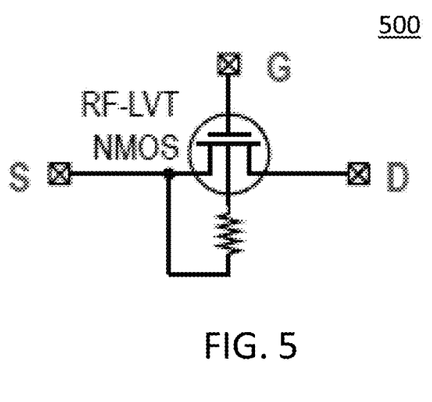
FIG. 5 is an example of an RF switch that can be used in a receiver in accordance with some embodiments.

RF switches 126 can be placed in a floating-body configuration to decrease their OFF capacitance and biased at a 0.2V source terminal voltage to reduce their ON resistance in some embodiments. An example 500 of a floating-body radio-frequency low-voltage threshold (RF-LVT) NMOS switch that can be used to implement an RF switch 126 in accordance with some embodiments is shown in FIG. 5.

Figure 6:
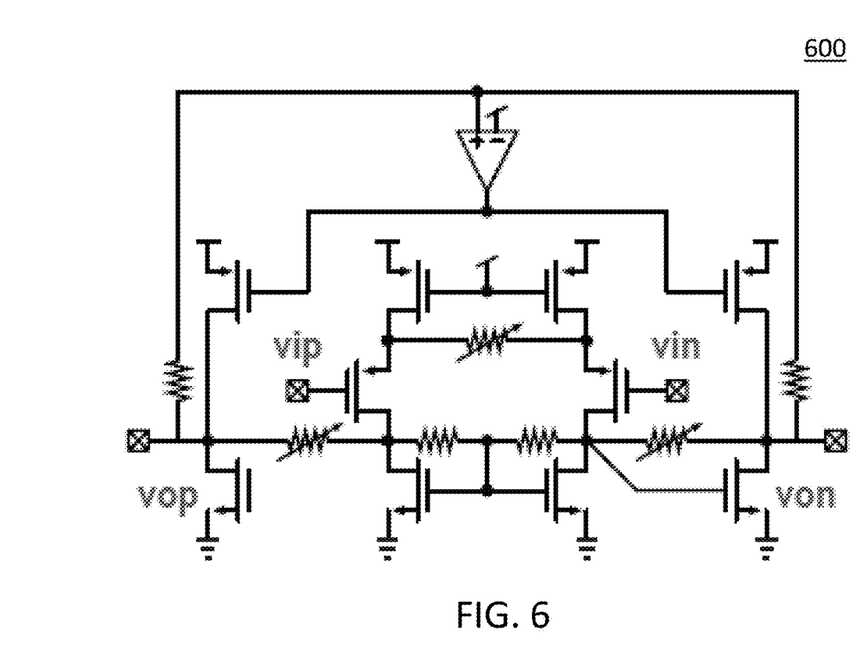
FIG. 6 is an example of a Cherry-Hooper amplifier that can be used in a receiver in accordance with some embodiments.

An example 600 of a Cherry-Hooper amplifier that can be used to implement amplifier 130 in accordance with some embodiments is shown in FIG. 6.

Clock path circuitry can include clock dividers, non-overlapping clock generators, two clock modulators, and a pseudo-random bit sequence (PRBS) synthesizer in some embodiments.

Figure 4:
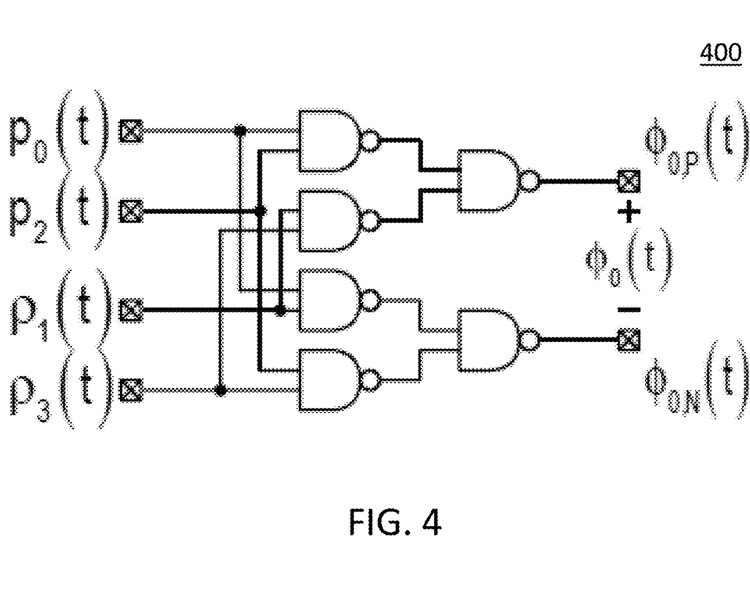
FIG. 4 is an example of a clock modulator cell that can be used in a receiver in accordance with some embodiments.

In some embodiments, the clock modulators can be implemented with NAND-based logic with delay-matching for all clock inputs. An example 400 of a clock modulator cell for phase $\phi_0$ that can be used to implement a clock modulator (shown in FIG. 1) in accordance with some embodiments is shown in FIG. 4. Similar clock modulator cells can be implemented for $\phi_1$, $\phi_2$, and $\phi_3$ by modifying clock modulator cell 400 consistent with the equations in box 202 of FIG. 2 in some embodiments.

The PRBS synthesizer can be any suitable PRBS synthesizer in some embodiments. In some embodiments, the PRBS synthesizer can generate both shift-register-based and linear feedback shift register (LFSR)-based PRBS sequences of any suitable length. In some embodiments, the PRBS synthesizer can be a Gold sequence generator.

In some embodiments, the LNTA branches and the mixer-first branches can operate independently with different clock sources or can be driven synchronously with the same clock. For example, in some embodiments, receiver 100 can operate in any one or more of a single-carrier reception mode, a dual-carrier reception mode, and compressive sampling scanning mode. In the single-carrier reception mode in some embodiments, only the $LB_1$ branch and the $MBF_1$ branch are turned on. In the dual-carrier reception mode in some embodiments, both LNTA branches and both mixer-first branches are active. In the compressive sampling scanning mode in some embodiments, the two LNTA branches are powered off and both mixer-first branches are active.

During operation, receiver 100 can use mixer-clock modulation to achieve dual-band tuned matching and concurrent dual carrier reception in some embodiments. In some embodiments, to receive signals at $F_{RF1}$ and $F_{RF2}$, a 4-phase non-overlapping RF clock at $F_C=(F_{RF1}+F_{RF2})/2$ can be modulated with a modulation clock at $F_M=(F_{RF1}-F_{RF1})/2$. When applying these modulated clocks to the mixer-first branches, the baseband impedance can be translated as a tuned response at $F_{RF1}$ and $F_{RF2}$ in some embodiments. Alternatively, if pseudo-random bit sequences (PRBS) are modulated on the RF clock ($F_C$), the mixer-first branches can perform compressive-sampling (CS) wideband spectrum scanning.

Figure 2:
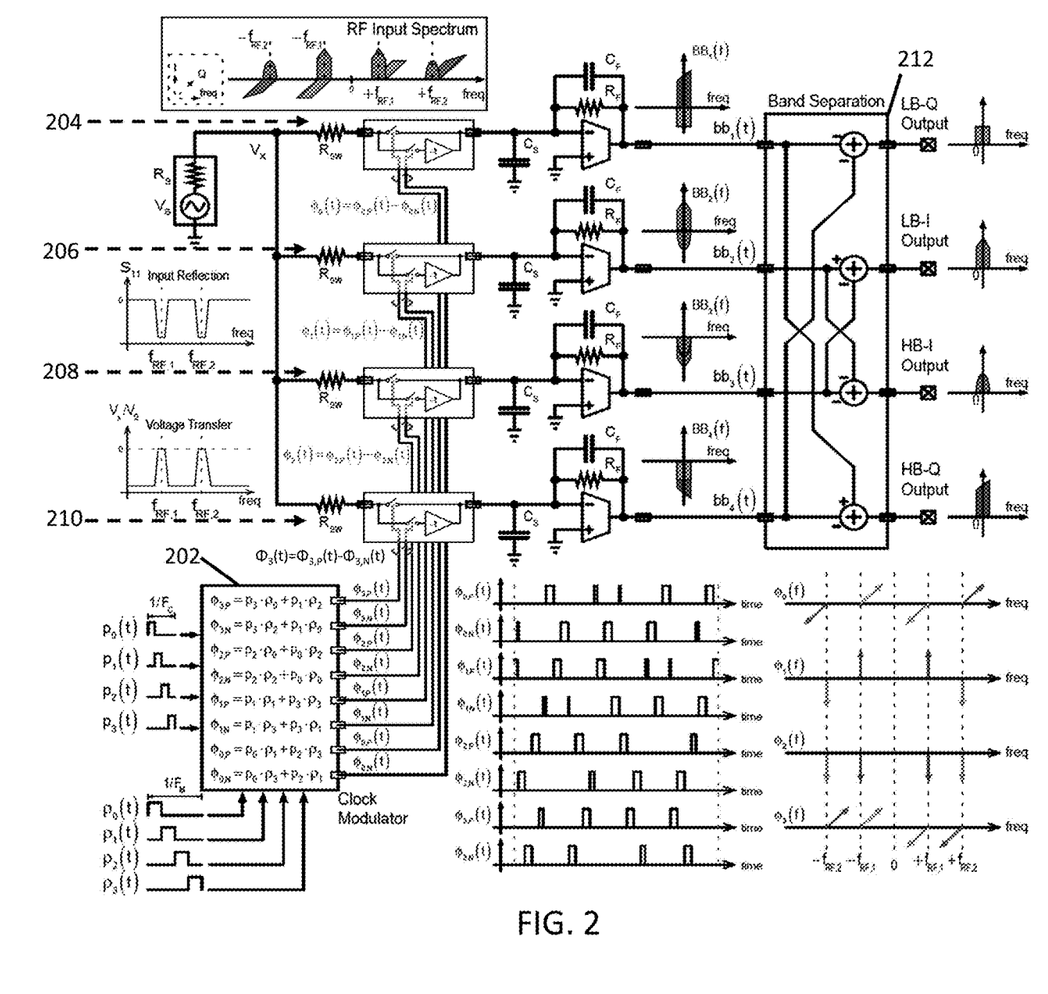
FIG. 2 is an example of a clock modulator, four mixer-first branches (illustrated in single-ended form), and a band separation circuit that can be used in a receiver in accordance with some embodiments.

As shown in FIG. 2, in some embodiments, four tri-level-modulated mixer clocks $\phi_0$-$\phi_3$ can be derived from two 4-phase 25% non-overlapping clocks $p_{0-3}(t)$ and $\rho_{0-3}(t)$ at $F_C$ and $F_M$, respectively, using a digital clock modulator 202 by either flipping or not flipping the polarity of the input clocks, or holding the outputs low as described by the formulas in box 202. When flipping the RF clock at a rate $F_M$ in FIG. 2, the $F_C$ tone in the RF clock is moved to two tones at $F_{RF1}=F_C-F_M$ and $F_{RF2}=F_C+F_M$. When one modulated clock of $\phi_0$-$\phi_3$ is low in FIG. 2, the other three modulated clocks of $\phi_0$-$\phi_3$ are switching. The four clocks $\phi_0$-$\phi_3$ can be guaranteed to be non-overlapping and have linearly-independent spectra in some embodiments.

Applying $\phi_0$-$\phi_3$ to mixer-first branches 204, 206, 208, and 210 (which are shown in a single ended configuration for purposes of clarity) translates the baseband impedance to $F_{RF1}$ and $F_{RF2}$ and achieves dual-band impedance matching. Meanwhile, the mixer-first branches concurrently down-convert the RF input signals at $F_{RF1}$ and $F_{RF2}$ to linearly independent baseband outputs. Simple addition and subtraction in band separation circuit 212 can be used to separate the I/Q components for each RF band to produce outputs LB-Q, LB-I, HB-I, and HB-Q.

A benefit of clock modulation in some embodiments is that the clock sources $F_C$ and $F_M$ are separated more widely than $F_{RF1}$ and $F_{RF2}$, which alleviates possible phase-locked loop (PLL) pulling issues. While spurious tones can exist in the modulated clocks due to intermixing of higher order harmonics of $F_C$ or $F_M$ in some embodiments, those spurious tones are expected to be out of band or mitigatable with frequency planning in some embodiments.

In some embodiments, low noise transconductance amplifiers (LNTA) branches, $LB_1$ and $LB_2$, driven by modulated clock sets $CLK_{LB1}$ and $CLK_{LB2}$ can be used to implement noise cancellation and improves the noise figure (NF) of the receiver. The two pairs of non-overlapping modulated clock sets $CLK_{LB1}$ and $CLK_{LB2}$ can be generated with 50% 4-phase $F_M$ clocks to modulate the 25% 4-phase $F_C$ RF clock.

In some embodiments, during a compressive sampling (CS) mode, clock $F_C$ can be 700 MHz and be modulated with a maximal-length PRBS sequence of length L=63 clocked at $F_M$ equal to 630 MHz. In some embodiments, during CS wideband scanning (e.g., with a CW input tone at 662 MHz, and two noise-modulated 2 MHz wide input signals at 693 MHz and 729 MHz), the mixer first branches with pseudo-random modulated clocks can down-convert the RF signals to baseband. The resulting signals can then be processed by CS DSP 118 (FIG. 1) which can use any suitable CS processing techniques as known in the art to identify signals in the scanned region.

Although specific components are described herein, it should be apparent that other components can be used to provide the same or similar functions and/or additional functions in some embodiments.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways

What is claimed is:

1. A circuit for a modulated-mixer-clock multi-branch receiver, comprising:
   a plurality of low-noise transconductance amplifier (LNTA) branches, each comprising:
   a cascode common-source LNTA,
   a plurality of passive mixers, and
   a plurality of baseband two-stage Miller compensated transimpedance amplifiers (TIAs),
   wherein an input to the cascode common-source LNTA is provided by a radio frequency (RF) signal source, an input to each of the plurality of passive mixers is provided by an output of the cascode common-source LNTA, and an input to each of the plurality of baseband two-stage Miller compensated TIAs is provided by an output of a corresponding one of the plurality of passive mixers;
   a plurality of mixer-first branches, each comprising:
   a plurality of RF switches,
   a plurality of baseband folded-cascode TIAs, and
   a plurality of Cherry-Hooper amplifiers,
   wherein an input to the plurality of RF switches is provided by the RF signal source, an input to each of the plurality of baseband folded-cascode TIAs is provided by an output of at least one of the plurality of RF switches, and an input to each of the plurality of Cherry-Hooper amplifiers is provided by an output of a corresponding one of the plurality of baseband folded-cascode TIAs;
   a first plurality of clock modulators that provide first non-overlapping modulated clocks that are provided to an input of the plurality of passive mixers; and
   a second plurality of clock modulators that provide a plurality of tri-level modulated mixer clocks that control the switching of the plurality of RF switches.

2. A circuit for a modulated-mixer-clock multi-branch receiver, comprising:
   a plurality of low-noise transconductance amplifier (LNTA) branches, each comprising:
   an LNTA,
   a plurality of passive mixers, and
   a plurality of transimpedance amplifiers (TIAs),
   wherein an input to the LNTA is provided by a radio frequency (RF) signal source, an input to each of the plurality of passive mixers is provided by an output of the LNTA, and an input to each of the plurality of TIAs is provided by an output of a corresponding one of the plurality of passive mixers;

a plurality of mixer-first branches, each comprising:
  a plurality of RF switches,
  a plurality of TIAs, and
  a plurality of amplifiers,
  wherein an input to the plurality of RF switches is provided by the RF signal source, an input to each of the plurality of TIAs is provided by an output of at least one of the plurality of RF switches, and an input to each of the plurality of amplifiers is provided by an output of a corresponding one of the plurality of TIAs;

a first plurality of clock modulators that provide first non-overlapping modulated clocks that are provided to an input of the plurality of passive mixers; and a second plurality of clock modulators that provide a plurality of tri-level modulated mixer clocks that control the switching of the plurality of RF switches.

3. The circuit of claim 2, wherein the LNTA in each of the plurality of LNTA branches is a cascode common-source LNTA.

4. The circuit of claim 2, wherein the plurality of TIAs in each of the plurality of LNTA branches are a plurality of baseband two-stage Miller compensated TIAs.

5. The circuit of claim 2, wherein the plurality of TIAs in the plurality of mixer-first branches are a plurality of baseband folded-cascode TIAs.

6. The circuit of claim 2, wherein the plurality of amplifiers in the plurality of mixer-first branches are a plurality of Cherry-Hooper amplifiers.

7. The circuit of claim 2, further comprising a first band separation circuit connected to an output of the plurality of TIAs of the plurality of LNTA branches.

8. The circuit of claim 7, further comprising a second band separation circuit connected to an output of the plurality of amplifiers of the plurality of mixer-first branches.

9. The circuit of claim 8, further comprising a noise cancellation circuit connected to an output of the first band-separation circuit and an output of the second band-separation circuit.

10. The circuit of claim 2, further comprising a DSP connected to an output of the plurality of amplifiers of the plurality of mixer-first branches.

11. The circuit of claim 10, wherein the DSP is a compressive-sampling DSP.

12. The circuit of claim 2, wherein one of the first plurality of clock modulators comprises:
  a first NAND gate having a first input, a second input, and an output;
  a second NAND gate having a first input, a second input, and an output;
  a third NAND gate having a first input, a second input, and an output, wherein the first input of the third NAND gate is connected to the first input of the first NAND gate, and wherein the second input of the third NAND gate is connected to the first input of the second NAND gate;
  a fourth NAND gate having a first input, a second input, and an output, wherein the first input of the fourth NAND gate is connected to the second input of the first NAND gate, and wherein the second input of the fourth NAND gate is connected to the second input of the second NAND gate;
  a fifth NAND gate having a first input, a second input, and an output, wherein the first input of the fifth NAND gate is connected to the output of the first NAND gate, and wherein the second input of the fifth NAND gate is connected to the output of the second NAND gate; and
  a sixth NAND gate having a first input, a second input, and an output, wherein the first input of the sixth NAND gate is connected to the output of the third NAND gate, and wherein the second input of the sixth NAND gate is connected to the output of the fourth NAND gate.

13. The circuit of claim 12, further comprising:
  a first four-phase non-overlapping clock generator having a first output, a second output, a third output, and a fourth output, and
  a second four-phase non-overlapping clock generator having a first output, a second output, a third output, and a fourth output,
  wherein:
    the first output of the first four-phase non-overlapping clock generator is connected to the first input of the first NAND gate;
    the third output of the first four-phase non-overlapping clock generator is connected to the second input of the first NAND gate;
    the second output of the second four-phase non-overlapping clock generator is connected to the first input of the second NAND gate; and
    the fourth output of the second four-phase non-overlapping clock generator is connected to the second input of the second NAND gate.

14. The circuit of claim 2, wherein one of the second plurality of clock modulators comprises:
  a first NAND gate having a first input, a second input, and an output;
  a second NAND gate having a first input, a second input, and an output;
  a third NAND gate having a first input, a second input, and an output, wherein the first input of the third NAND gate is connected to the first input of the first NAND gate, and wherein the second input of the third NAND gate is connected to the first input of the second NAND gate;
  a fourth NAND gate having a first input, a second input, and an output, wherein the first input of the fourth NAND gate is connected to the second input of the first NAND gate, and wherein the second input of the fourth NAND gate is connected to the second input of the second NAND gate;
  a fifth NAND gate having a first input, a second input, and an output, wherein the first input of the fifth NAND gate is connected to the output of the first NAND gate, and wherein the second input of the fifth NAND gate is connected to the output of the second NAND gate; and
  a sixth NAND gate having a first input, a second input, and an output, wherein the first input of the sixth NAND gate is connected to the output of the third NAND gate, and wherein the second input of the sixth NAND gate is connected to the output of the fourth NAND gate.

15. The circuit of claim 14, further comprising:
  a first four-phase non-overlapping clock generator having a first output, a second output, a third output, and a fourth output, and
  a second four-phase non-overlapping clock generator having a first output, a second output, a third output, and a fourth output, wherein:
the first output of the first four-phase non-overlapping clock generator is connected to the first input of the first NAND gate;
the third output of the first four-phase non-overlapping clock generator is connected to the second input of the first NAND gate;
the second output of the second four-phase non-overlapping clock generator is connected to the first input of the second NAND gate; and
the fourth output of the second four-phase non-overlapping clock generator is connected to the second input of the second NAND gate.

16. The circuit of claim 2, further comprising a pseudo-random bit sequence (PRBS) generator coupled to the first plurality of clock modulators.

17. The circuit of claim 2, further comprising a pseudo-random bit sequence (PRBS) generator coupled to the second plurality of clock modulators.

* * * * *